(12) United States Patent
Liu

(10) Patent No.: US 9,297,910 B2
(45) Date of Patent: Mar. 29, 2016

(54) TILE MOUNTING FOR PET DETECTORS

(71) Applicant: KONINKLIJKE PHILIPS N.V., Eindhoven (NL)

(72) Inventor: Jinling Liu, Solon, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/366,813

(22) PCT Filed: Dec. 17, 2012

(86) PCT No.: PCT/IB2012/057365
§ 371 (c)(1),
(2) Date: Jun. 19, 2014

(87) PCT Pub. No.: WO2013/098699
PCT Pub. Date: Jul. 4, 2013

(65) Prior Publication Data
US 2014/0361181 A1    Dec. 11, 2014

Related U.S. Application Data

(60) Provisional application No. 61/580,444, filed on Dec. 27, 2011, provisional application No. 61/598,369, filed on Feb. 14, 2012.

(51) Int. Cl.
*G01T 1/202* (2006.01)
*G01T 1/161* (2006.01)
*G01T 1/24* (2006.01)
*G01T 1/208* (2006.01)
(Continued)

(52) U.S. Cl.
CPC .............. *G01T 1/202* (2013.01); *G01T 1/1618* (2013.01); *G01T 1/208* (2013.01); *G01T 1/248* (2013.01); *G01T 1/249* (2013.01); *G01T 1/2985* (2013.01); *H05K 7/2039* (2013.01)

(58) Field of Classification Search
CPC ...... A61B 6/037; G01T 1/1618; G01T 1/249; G01T 1/243; G01T 1/202; G01T 1/2985
USPC ........................................................ 250/366
See application file for complete search history.

(56) References Cited

U.S. PATENT DOCUMENTS

| 5,635,718 | A | 6/1997 | DePuydt et al. |
| 6,586,744 | B1 * | 7/2003 | Griesmer et al. ........ 250/370.15 |
| 7,030,387 | B2 * | 4/2006 | Serebryanov et al. ... 250/370.15 |

(Continued)

FOREIGN PATENT DOCUMENTS

| DE | 102008064486 A1 | 7/2010 |
| EP | 0521708 A1 | 1/1993 |

(Continued)

*Primary Examiner* — Marcus Taningco

(57) ABSTRACT

A nuclear scanner includes an annular support structure (32) which supports a plurality of detector modules (30). Each detector module includes a cooling and mounting structure (34) to which a plurality of tiles (40) are mounted by passing pins (46-49) through holes (38) in the cooling and mounting structure (34) to position each tile and thermally connect each tile to the cooling and mounting structure (34). A tile mount (44) on the side of the tile that makes contact with the cooling and mounting structure has a smooth face to make contact with the cooling and mounting structure to provide good thermal contact between the tile (40) and the cooling and support structure (34).

17 Claims, 8 Drawing Sheets

(51) Int. Cl.
*G01T 1/29* (2006.01)
*H05K 7/20* (2006.01)

(56) References Cited

U.S. PATENT DOCUMENTS

| | | | |
|---|---|---|---|
| 7,034,935 B1 * | 4/2006 | Kruzelecky | 356/328 |
| 7,511,277 B2 | 3/2009 | Ueno et al. | |
| 7,714,296 B2 | 5/2010 | Ohta et al. | |
| 8,581,197 B2 * | 11/2013 | Tonami et al. | 250/363.03 |
| 8,740,168 B2 * | 6/2014 | Hunt et al. | 248/346.01 |
| 2002/0148970 A1 * | 10/2002 | Wong et al. | 250/394 |
| 2004/0149924 A1 | 8/2004 | Russell | |
| 2005/0023475 A1 | 2/2005 | Li et al. | |
| 2005/0067579 A1 * | 3/2005 | Tsuchiya et al. | 250/370.15 |
| 2007/0158574 A1 * | 7/2007 | Petrillo et al. | 250/370.13 |
| 2008/0011950 A1 * | 1/2008 | Rose et al. | 250/339.03 |
| 2010/0188082 A1 * | 7/2010 | Morich et al. | 324/307 |
| 2011/0192983 A1 | 8/2011 | Yu et al. | |
| 2011/0248177 A1 | 10/2011 | Crocker et al. | |

FOREIGN PATENT DOCUMENTS

| | | |
|---|---|---|
| GB | 2332608 A | 6/1999 |
| JP | 2008232873 A | 10/2008 |
| JP | 2009077967 A | 4/2009 |
| WO | 2008003351 A1 | 1/2008 |
| WO | 2009125309 A2 | 10/2009 |
| WO | 2010067220 A2 | 6/2010 |

* cited by examiner

US 9,297,910 B2

TILE MOUNTING FOR PET DETECTORS

CROSS REFERENCE TO RELATED APPLICATIONS

This application is a national filing of PCT application Serial No. PCT/IB2012/057365, filed Dec. 17, 2012, published as WO 2013/098699 A2 on Jul. 4, 2013, which claims the benefit of U.S. provisional application Ser. No. 61/580,444 filed Dec. 27, 2011 and U.S. provisional application Ser. No. 61/598,369 filed Feb. 14, 2012, both of which are incorporated herein by reference.

The present application relates to diagnostic imaging systems and methods. It finds particular application to positron emission tomography (PET) or single-photon emission computed tomography (SPECT) systems with a secondary imaging modality, examples of which include computed tomography (CT), magnetic resonance (MR) imaging, and SPECT. The following also finds application to stand-alone PET or SPECT scanners.

Solid-state PET detectors are usually made of scintillator crystals coupled to an array of detector diodes on a Printed Circuit Board (PCB) to form a detector stack. This detector stack, sometimes called a tile, is then plugged into a bigger PCB which holds multiple stacks. In some designs, the detector stack plugs into the larger PCB using rigid connectors, and the tile stacks are then clamped between the larger PCB and the frame of the detector. This configuration leaves little room for cooling, making design of the cooling system difficult. Clamping the tiles to its associated electronics also makes alignment and accurate placement of the stacks difficult as the tolerances of the connectors add up and can affect the position of the PET detectors. Furthermore, the design can be difficult to service and unreliable. Because detectors are often mounted in a configuration having more than 2×2 tiles (e.g., 4×5, 4×6, or 4×7), not all sides of the detectors are accessible. In a 4×7 configuration, there are ten tiles with no accessible sides. Dismounting a detector with no exposed sides can damage the detectors adjacent to it in order to get a tool or a finger on the edges of the detector that is to be removed. When dismounting a detector with only one exposed side, the detector can be torqued by only having force applied to one side, causing bending and potential damage to the circuitry or detector crystals.

The present application proposes to address these problems with a tile mounting structure. Tile mounts shaped in the footprint of the stack have a plurality of pins to position and retain the stacks.

A tile is disclosed which comprises an array of radiation detectors which generate signals in response to receiving radiation events, associated electronics, and a mount which mounts the tile to and in thermal communication with a support structure and which positions a mounting face of the tile relative to the support structure. The tile may include a plurality of pins, some of which may be threaded, configured to extend through apertures in the support structure. The tile mount may define a flat contact surface configured to thermally contact a complimentary surface of the support structure. The surface of the tile that contacts the support structure may also have feet or spacers. The tile may have bores to receive pins to mount the tile to the mounting structure. The tile may have an electrical connector disposed on or recessing in the mounting face of the tile. The radiation detectors may be one of scintillation crystals optically connected with silicon photo multipliers and solid state radiation detectors. A radiation detection module may comprise a plurality of tiles and a cooling and mounting structure. The module may include a plurality of holes which receive pins which mount the tiles to the cooling and mounting structure. The cooling and mounting structure may define a complimentary mounting face to which the mounting face of the tile is mounted. There may be thermal paste or elements between the tiles and the cooling and mounting structure. The cooling and mounting structure may define apertures which provide access to electrical connectors of the tiles. The cooling and mounting structure may have more electrical connector apertures and holes for mounting pins than the number of mounted tiles.

A plurality of the modules may be mounted in an annular support structure of a PET scanner. The annular support structure may include a pair of rings on which the modules are mounted. The cooling and mounting structure may have a cooling plate which defines more electrical connector apertures and holes for receiving mounting pins than the number of tiles and may further include a spacer assembly in a space between the tiles and one of the detector rings which blocks the tiles from receiving oblique radiation. The spacer assembly may include a movable shield ring adjacent to the detector modules, a support ring, and a spacer disposed between the movable shield ring and the support ring.

A method of mounting a radiation detector array is also disclosed. The method comprises mounting each of a plurality of tiles in a cooling and mounting structure and then positioning and mounting the cooling and mounting structure to an annular support structure. The mounting may also include dismounting the cooling and mounting structure from the annular support structure and removing one of the tiles from the support structure to repair, align, or replace the tile. The method may also include mounting new, replacement, or additional tiles and remounting the cooling and mounting structure to the annular support structure.

Also disclosed is a generally annular PET detection system comprising a plurality of annular support rings, a plurality of modules mounted to the annular support rings (each module includes a cooling and support plate assembly having a plurality of holes through the cooling and support plate), and a plurality of tiles, each tile comprising a detector, mounted to and supported by the cooling and support plate assembly of the respective module by pins received in the holes such that a tile without any exposed sides can be removed from the module without removing adjacent tiles by pushing the pins of the tile to be removed out of the respective holes of the module.

A generally annular PET detection system is also disclosed. The system comprises a pair of annular support rings, a first annular shield ring disposed adjacent a first of the annular support rings, a plurality of modules mounted to and supported by the annular support rings (each module includes a cooling and support plate assembly which defines electrical connector apertures), and a plurality of tiles. Each tile comprises a detector and an electrical connector on or recessed in a face of the tile such that the electrical connector aperture receives the electrical connector. Each tile is mounted to and supported by the cooling and support plate assembly of the respective module, and the cooling and support plate assembly defines more electrical connector apertures than the number of mounted tiles, allowing a different numbers of tiles to be mounted to the respective module in a group with a first side of the group adjacent the first annular shield ring. The system also comprises a moveable annular shield ring movably mounted between a second of the annular support rings and the plurality of tiles such that the movable annular shield ring is positioned adjacent a second side of the group of tiles such that the movable annular shield ring can be disposed to accommodate different numbers of tiles.

One advantage resides in positioning detectors with greater accuracy (more accurate alignment).

Another advantage resides in simplified dismounting or removing detector stacks.

Another advantage resides in improved heat transmission and cooling.

Still further advantages of the present invention will be appreciated to those of ordinary skill in the art upon reading and understanding the following detailed description.

The invention may take form in various components and arrangements of components, and in various steps and arrangements of steps. The drawings are only for purposes of illustrating the preferred embodiments and are not to be construed as limiting the invention.

FIG. 1 diagrammatically illustrates a perspective diagrammatic illustration of a hybrid system having magnetic resonance (MR) scanner and positron emission tomography (PET) scanner.

Figure 1:
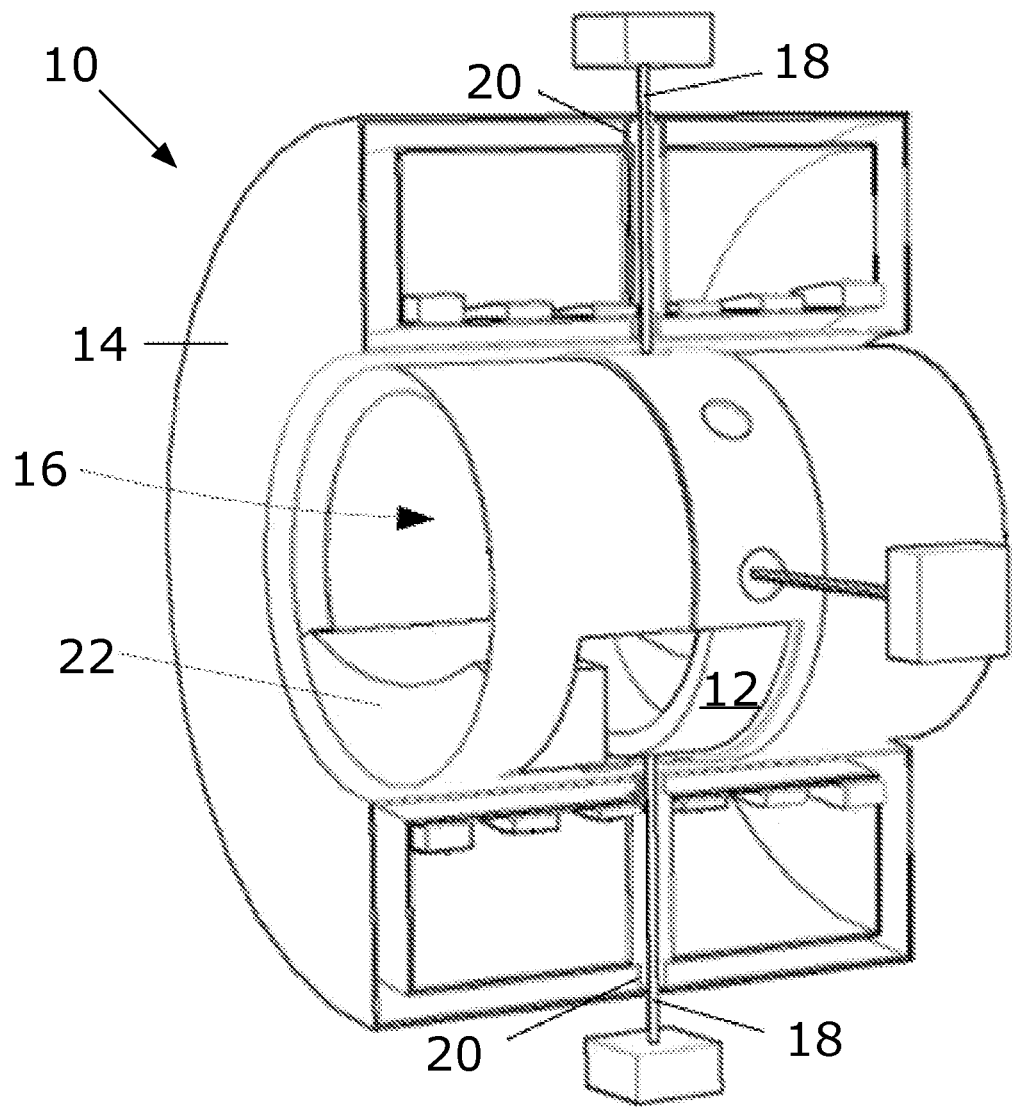

With reference to FIG. 1, a hybrid PET/MR scanner 10 has a generally annular PET detection system 12 disposed in the gap between the gradient coil and RF coil of an MR scanner. The generally annular PET detection system 12 and the MR scanner are configured to image a common imaging region 16. The PET detection system 12 is independently supported by mounting members 18 that pass through openings 20 in the magnet housing 14 and between the MR components.

A subject support 22 and/or the PET gantry 12 are continuously or stepwise moved longitudinally relative to each other to generate list-mode PET data sets that identify detected radiation events and times of detection. This allows each detector to cover a continuum of longitudinal spatial locations during the scan which results in finer PET acquisition sampling in the longitudinal or z direction. Stepping in short longitudinal increments, e.g. smaller than the longitudinal detector spacing, is also contemplated. The detectors could also be moved circumferentially continuously or in analogous small steps.

In PET scanning, a pair of gamma rays is produced by a positron annihilation event in the imaging region 16 and travel in diametrically opposite directions. When the gamma rays strike the detectors, the locations of the struck detector elements and the strike time are recorded. A singles processing unit monitors the recorded gamma ray events for single gamma ray events that are not paired with a temporally close event. The temporally close pairs of events define lines of response (LORs), which are reconstructed into a PET image.

Figure 2:
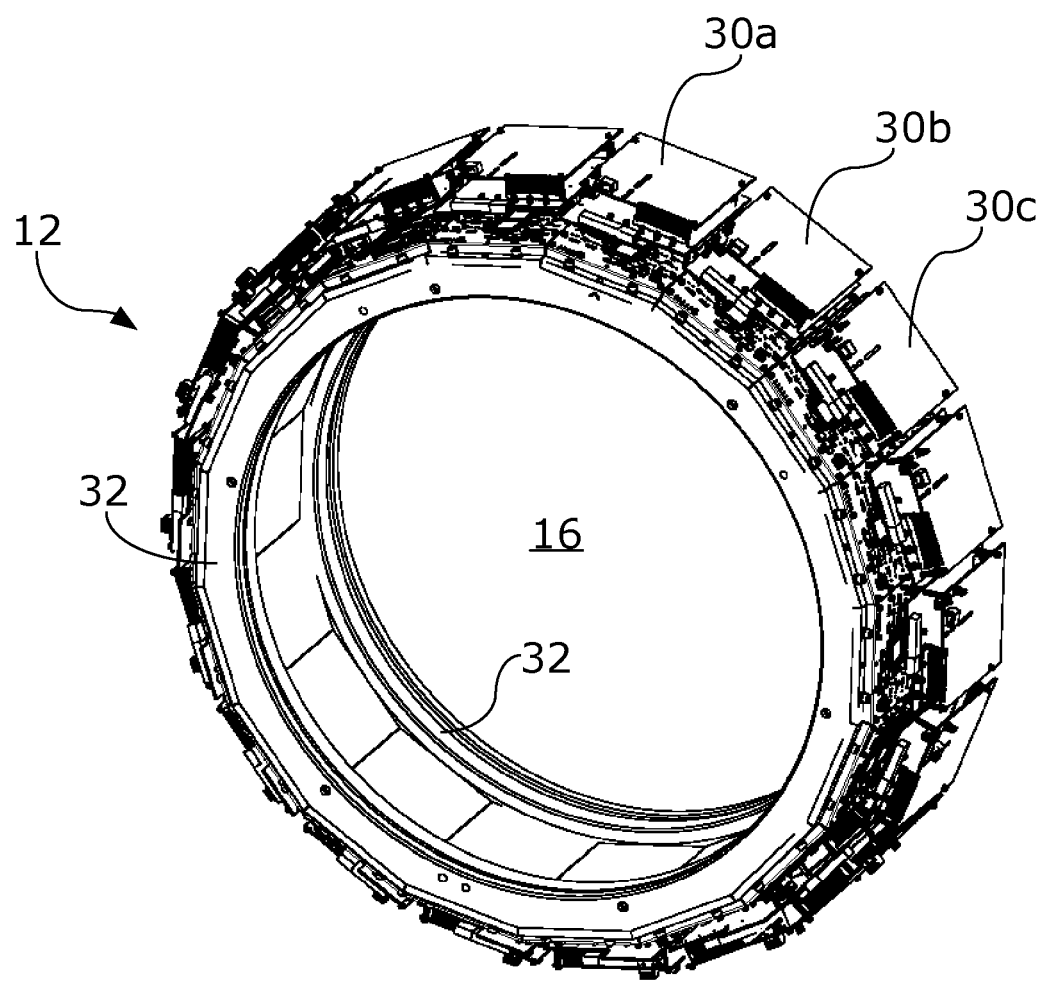
FIG. 2 illustrates a PET detector ring.

FIG. 2 shows the PET detection system 12 from the combined PET/MR scanner or a PET only scanner. The scanner has an illustrated ring which supports 18 modules (three of which are labeled 30a, 30b, and 30c) mounted on an outer surface of a pair of annular rings forming an annular support structure 32. Of course, more or fewer modules may be provided, depending on the size of the detector modules and the diameter of the rings and imaging region 16.

Figure 3:
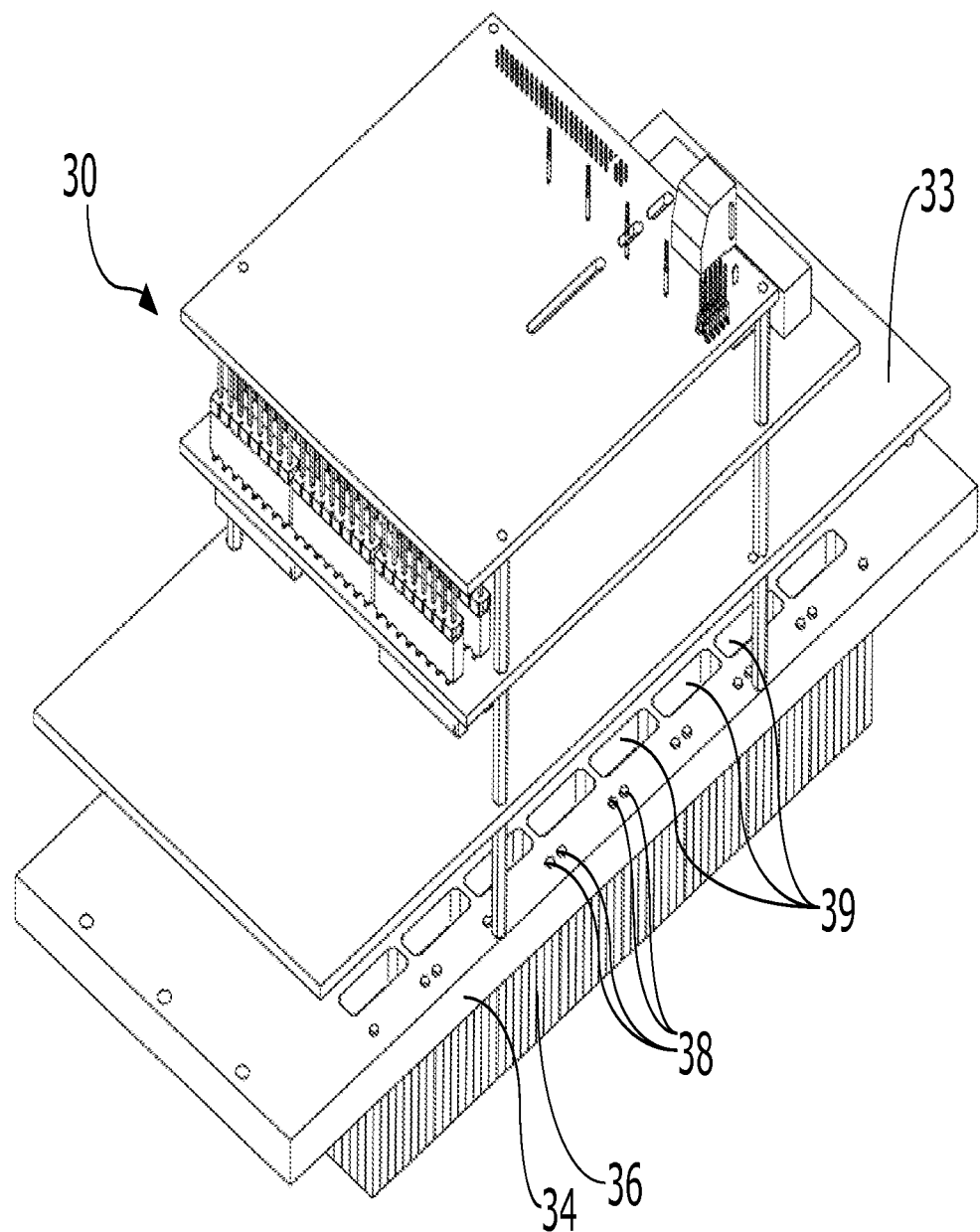
FIG. 3 illustrates an individual PET detector module with housing removed to reveal the scintillation crystals.

With reference to FIG. 3, a detector module 30 is shown. Each detector module 30 includes a cooling and support plate assembly 34. A plurality of scintillator crystal arrays 36 are optically coupled to a plurality of photo detector arrays (labeled 42 in FIG. 4) and the detector array is then mounted to a tile mount which is in turn mounted to the cooling plate.

In the orientation of FIG. 3, down is toward the center of the scanner examination region 16. The lowest level of the module (innermost with respect to the examination region) is the scintillation crystals, which form an array. The scintillation crystal array is mounted below and connected to the photodiode array to form a photodetector array. The photodiode of the photodetector array is attached to a tile mount (44 of FIG. 4 but not visible in FIG. 3). This tile mount is then attached to the cooling and support plate assembly 34. Electrical connectors (not shown) connect the tile boards to singles processing boards 33 mounted above the cooling and support plate. These electrical connectors run through matching apertures 39 in the tile and cooling support plate 34. In one embodiment, the apertures are oblong rectangles to accommodate either an electrical connector or flex cable. The printed circuit boards 33 are mounted above the cooling plate but not in contact with the cooling plate, as the PCBs do not need as much cooling as the photodetectors. The cooling plate 34 has a plurality of mounting holes (four of which are labeled 38) to accept pins (labeled as 46, 47, 48, and 49 in FIG. 4) for mounting tiles and larger apertures (three of which are labeled 39) for the connectors to pass through. The cooling and support plate assembly 34 maintains the detector arrays and the scintillation crystals at a substantially constant chilled temperature. In some embodiments, the cooling plate includes a thermally conductive wall or skirt that extends down from the plate and surrounds the scintillator array. The cooling is provided by, for example, cooling tubes in the cooling and support plate to allow a fluid to circulate through the plate.

Figure 4:
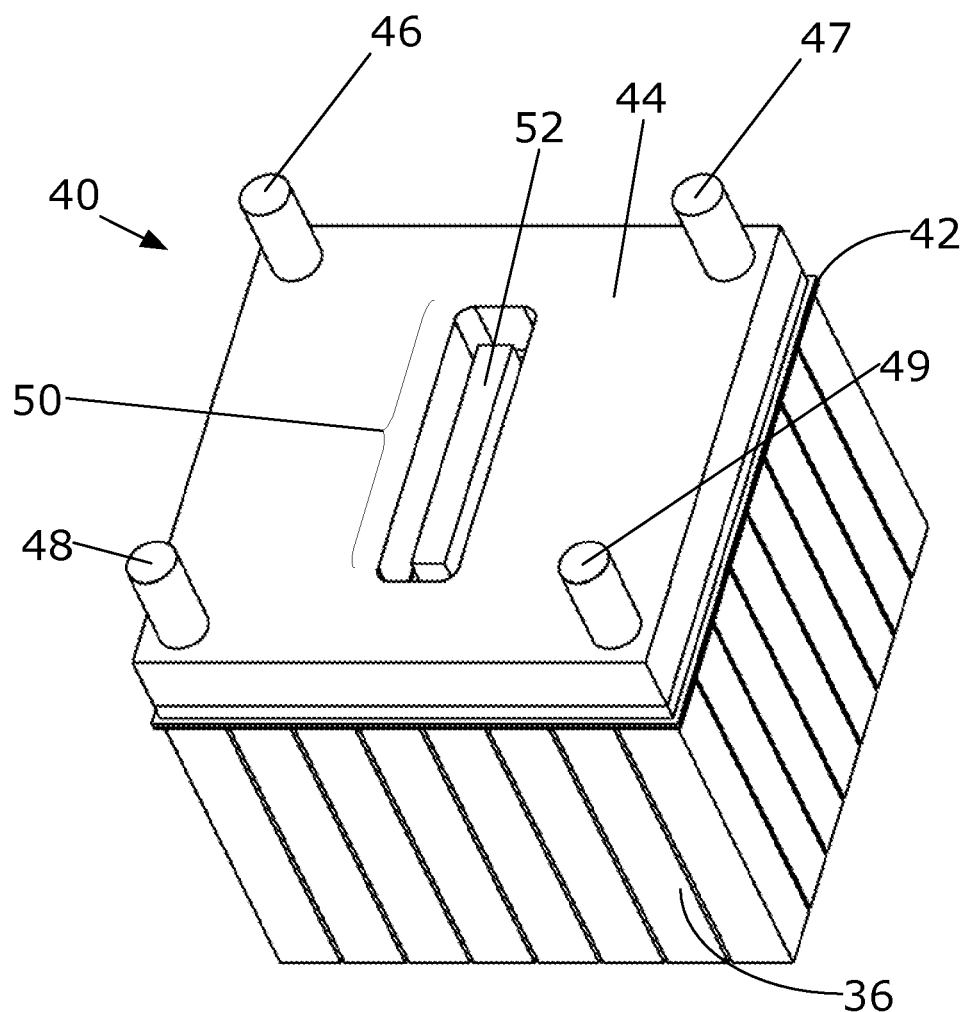
FIG. 4 illustrates a tile with its attached photodetector and scintillation crystals.

With reference to FIG. 4, a tile 40 is shown. The tile 40 includes a scintillation crystal array 36 optically connected to photodetectors 42 which are attached to the tile mount 44. Because the photodetector's performance varies with its operating temperature, it is important to keep it at a substantially constant chilled temperature. Because the top (opposite side from the crystals) of the photodetector has electronic components, in some embodiments, its surface can be irregular. Mounting the photodetector directly to the cooling plate or mounting the photodetector to the cooling plate with a thermal pad between the photodetector and cooling plate may not provide continuous thermal contact because of the surfaces of the electronics. The void between the photodetector and the tile mount 44 is filled with thermal paste or other thermally (but not electrically) conductive material. The thermal paste, by filling in the irregular surfaces of the components on the photodetector, ensures good thermal contact between the photodetector and the tile mount 44. The top of the tile mount 44 is smooth, facilitating good thermal contact between the top of the tile mount and the cooling plate 34, though a thin layer of thermal paste may also be used to ensure good contact between the plate 34 and the tile mount 44.

In addition to providing thermal contact, the tile mount also facilitates accurate positioning of the photodetectors, which is important for the image scanner's performance. Pins 46-49 mechanically position the tile mount. In one embodiment, two pins, for example 46 and 49, are smooth and mainly position the tile mount with respect to the cooling plate 34. Two other pins, for example 47 and 48, may be threaded to firmly attach the tile mount to the cooling plate with a nut on the opposite side of the cooling plate from the tile mount 44. Advantageously, this configuration allows a center tile (e.g. a tile surrounded by other tiles with no exposed edges) to be removed by removing the nuts and applying force to push the pins out of the cooling plate, ejecting the individual tile without having access to its sides. If all four pins are pushed at substantially the same time, the tile will not experience a torque when removed, decreasing the likelihood that the electronics are damaged. All four holes 38 in the cooling plate 34 can be smooth and substantially the same size, simplifying manufacture of the cooling plate. In one embodiment, the top surface of the tile mount and the lower surface of the cooling plate are precisely machined with complimentary surfaces to ensure good thermal transfer and precise angular positioning of the tile.

The tile mount has an aperture 50 through the top surface for a connector 52. More than one aperture will be needed if more than one connector exists for each tile. The aperture 50 is approximately the same size and shape as the aperture in the cooling plate (39 of FIG. 3) so that when the pins 46-49 enter holes 38, the aperture 50 on the tile aligns with the aperture 39 in the cooling plate, allowing a connector 52 from the photodetector array to pass through the tile and cooling plate to electrically connect the photodetector array to a PCB.

Figure 5:
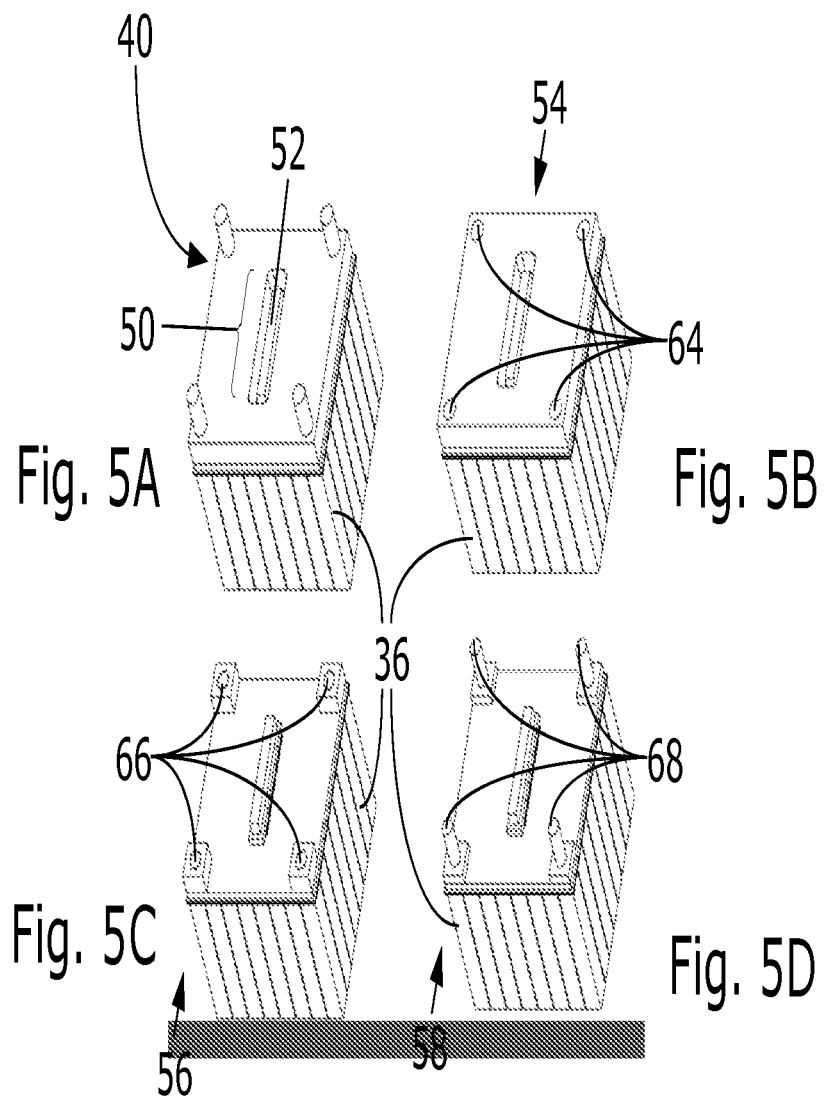
FIGS. 5A-5D illustrate alternate tile embodiments.

Other pin configurations are contemplated. For example, all four pins 46-49 may be threaded. All four pins may also be smooth and some other fastening mechanism used. For example, the pins 46-49 could be clevis pins. With reference to FIGS. 5A-5D, three other embodiments 54, 56, and 58 of the tile 40 are shown. In FIG. 5B, the tile mount 54 has holes 64 such as threaded bores and would be coupled with a cooling plate having pins or bores to receive threaded pins. Instead of attaching a plate to the photodetector printed circuit board as shown in FIG. 5A and FIG. 5B, a plurality of individual feet can be attached to the photodetector printed circuit board, as shown in FIG. 5C and FIG. 5D. In FIG. 5C, the tile mount 56 has four feet 66 with holes or threaded bores to accept pins from a cooling plate or threaded elements through the cooling plate. The cooling plate mating in FIGS. 5B and 5C both use pins from the cooling plate or passing through the cooling plate. In FIG. 5C, a thermal pad or thermal paste is disposed between the top surface of the tile and the cooling plate to transmit heat through the space created by the height of the shoulders 66. In FIG. 5D, the tile 58, similarly to tile 40, has the pins on the tile, but has shouldered feet 68. The shoulders of the tile 58 and feet of 56 create a space for the electronics of the photodetector so they are not damaged when the tile is attached to the cooling plate. In tile 58, similarly to tile 56, a thermal pad or paste the height of the feet conducts heat from the photodetector array to the cooling plate. In the embodiment of FIGS. 5C and 5D, the connector extends from the top surface of the tile. The connector can extend only the height of the feet or can extend into or through the aperture in the cooling plate.

Figure 6:
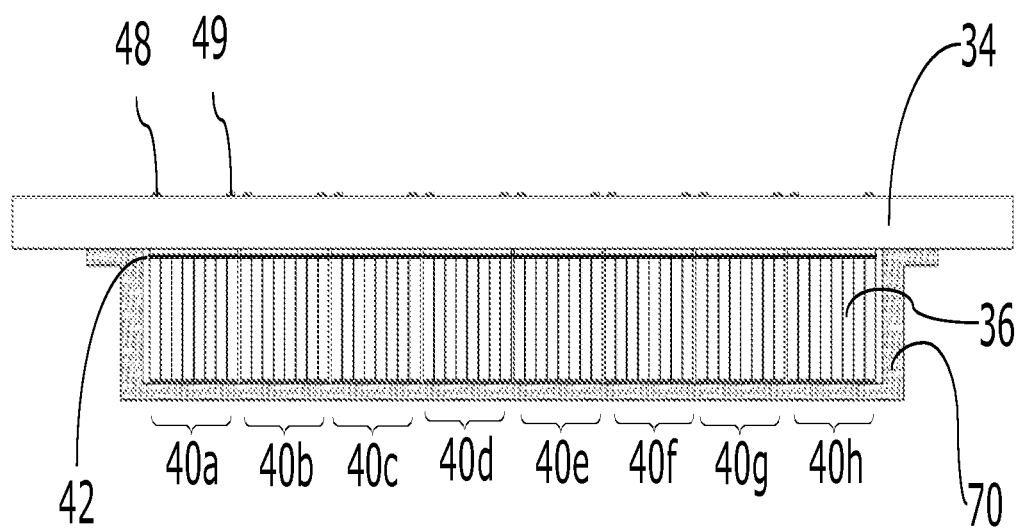
FIG. 6 is a side view illustrating multiple tiles attached to a cooling plate.

FIG. 6 shows a side view of the cooling plate and support structure 34 with tiles 40*a-h* (collectively referred to as 40) mounted underneath it (as in the previous figures, down points toward the center of the examination region 16). The tiles 40 are mounted underneath and attached to the cooling plate 34 by the tile mount 44 which is only visible by its pins 48 and 49 because a portion of the cooling and support housing 34 extends down from the plate portion to form a skirt that the tiles are mounted within. Attached to the cooling plate 34 is a housing 70, which in one embodiment is thick along the sides to define the skirt and provide mechanical strength and has a thin layer of aluminum or other material that does not substantially block radiation events across the radiation receiving face. A thin layer of elastic material (not shown), e.g. porous foam, can be installed in between the crystal arrays and the housing 70 to compensate the manufacturing tolerance. In one embodiment, the housing 70 is attached to the cooling plate 34 at the top and covers the tiles 40 underneath and on all four sides. For purposes of illustration, the housing 70 is shown cutaway on its side to reveal the tiles 40.

Figure 7:
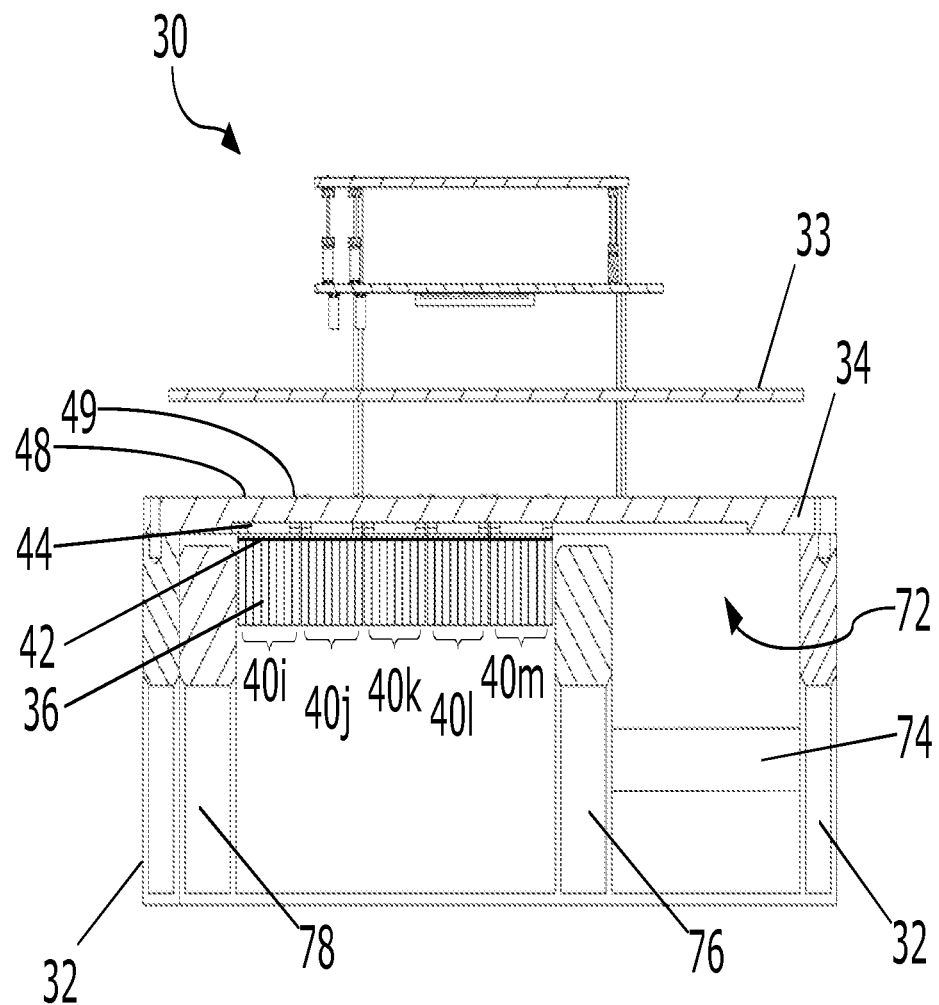
FIG. 7 is a side view in partial section illustrating a detector module with accompanying cooling and support structures mounted on support rings with an annular spacer to allow for extra detector ring width to allow optional tiles to be installed.

The tile mounts allow the tiles to be easily installed, facilitating expandability of the PET scanner. The PET scanner can be sold in a configuration that has room for future tiles to be added, illustrated by the module in FIG. 7. As before, a cooling plate 34 supports the tiles 40*i*-40*m*, but there is an empty space 72 adjacent to the tiles 40*i*-40*m* underneath the cooling plate 34 to accept future tiles, if desired. This empty space holds a spacer 74 and movable shield ring 76. The movable shield ring 76 is disposed directly adjacent to and extends slightly below the tiles 40 and blocks stray radiation from entering the detector crystals 36 from the sides. In addition to the shielding adjacent to the side of the tiles next to the spacer, there is another shield 78 on the exterior side (opposite side from the spacer) of the tiles. A pair of support rings 32, on the exterior side of the spacer and the exterior side of the tile array, supports the detectors via the cooling plates 34. Of course, spacer 74 can also be a plurality of spacer bars.

Other types of detectors are contemplated besides a Silicon Photomultiplier (SiPM) detector coupled with a scintillation crystal. A Cadmium Zinc Telluride (CZT) or other solid state detector is contemplated. A scintillation crystal array coupled with a photomultiplier tube is also contemplated. The detector or the crystal may be pixilated. Anger logic may be used.

Figure 8:
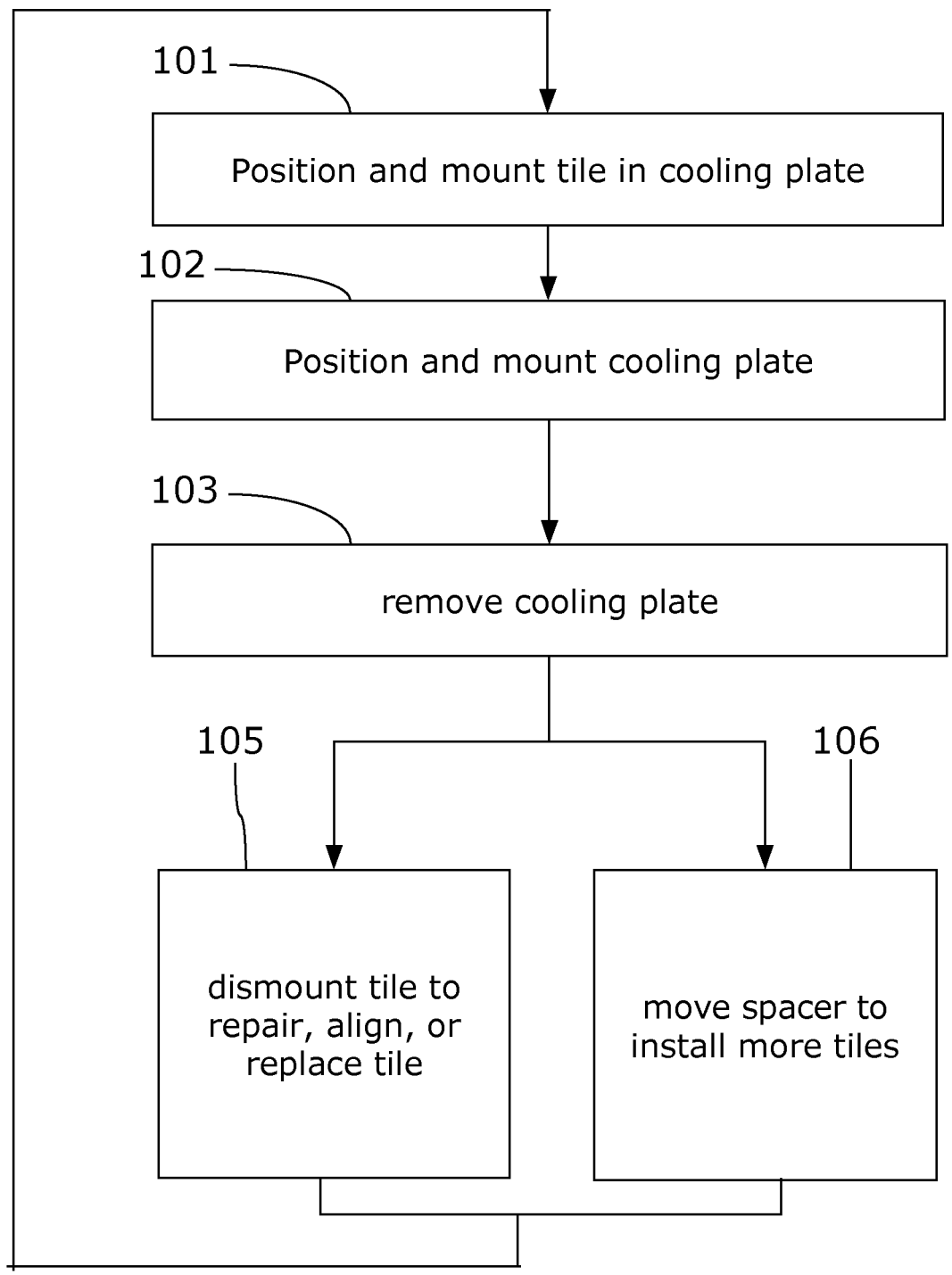
FIG. 8 is a flow chart illustrating a method for installing a tile in a diagnostic scanner.

A method of mounting the detector crystals includes the steps shown in FIG. 8. In a step 101, the tile is mounted in the support and cooling structure 34. In a step 102, the support and cooling structure 34 is mounted to the support rings 32. In a step 103, the cooling plate is removed, either to repair/replace a tile or add more tiles. In a step 105, a tile is dismounted and repaired, replaced, or realigned. In a step 106, the spacer 76 is moved to allow room for additional tiles to be installed. Returning to the step 101, replacement, repaired, or additional tiles are installed and in the step 102 the cooling plate is remounted on the support rings.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A tile configured to be assembled with like tiles into an array to form a detector for positron emission tomography (PET), the tile comprising:
    an array of radiation detectors and associated electronics which are configured to generate signals in response to receiving radiation events;
    a mount which is configured to mount the tile to and in thermal communication with a cooling and mounting structure and which is configured to position a mounting face of the tile relative to the cooling and mounting structure.

2. The tile according to claim 1, wherein the mount includes:
    a plurality of pins configured to extend through holes in the cooling and mounting structure such that the tile is removable from the cooling and mounting structure by pushing the pins from A rear of the cooling and mounting structure.

3. The tile according to claim 2, wherein at least some of the pins are threaded to receive a nut.

4. The tile according to claim 2, wherein
the array of radiation detectors includes an electrical connector disposed facing the mount; and
the mount has an aperture aligned with the electrical connector, such that the electrical connector is accessible from the rear of the cooling and mounting structure through the mount aperture and an aligned cooling and mounting structure aperture.

5. The tile according to claim 4, wherein the mount defines a flat contact surface configured to thermally contact a complimentary surface of the cooling and mounting structure.

6. The tile according to claim 1 further including:
feet or spacers disposed on a surface of the tile which contacts the cooling and mounting structure.

7. The tile according to claim 1, wherein
the array of radiation detectors includes an electrical connector disposed facing the mount; and
the mount has an aperture aligned with the electrical connector, such that the electrical connector is accessible from a rear of the cooling and mounting structure through the mount aperture and an aligned cooling and mounting structure aperture.

8. The tile according to claim 1 wherein the radiation detectors include one of:
scintillation crystals optically connected with silicon photomultipliers; and
solid state radiation detectors.

9. A radiation detection module comprising:
a cooling and mounting structure defining an array of pin receiving holes and apertures;
an array of thermally conductive mounts having pins configured to be received in the pin receiving holes of the cooling and mounting structure and having mount apertures that align with the cooling and mounting structure apertures when the mount pins are received in the cooling and mounting structure holes, such that when the pins are received in the holes, the mount has a contact surface in thermal contact with a complementary surface of the cooling and mounting structure and the pins extend through the cooling and mounting structure holes;
an array of radiation detectors mounted to and in thermal contact with each of the mounts to define a tile, the array of radiation detectors including an electrical connector which is accessible through the mount and cooling and mounting structure apertures when the mount pins are received in the cooling and mounting structure holes, wherein the tiles are in a closely packed array with limited access to sides of the tiles making removal of an individual one of the tiles from a detector side without damaging the tile or neighboring tiles tenuous, such that one of the tiles is replaceable by disconnecting electrical connections from the electrical connector via aligned mount and cooling and mounting structure apertures and pressing the pins extending through the cooling and mounting to eject the one of the tiles.

10. The module according to claim 9 further including:
a thermal paste or elements disposed between the tiles and the cooling and mounting structure.

11. The module according to claim 9, wherein the cooling and mounting structure defines more electrical connector apertures and holes for receiving tile mounting pins than the number of mounted tiles such that additional tiles can be added later to enlarge an examination region.

12. A PET scanner comprising:
an annular support structure; and
a plurality of radiation detector modules according to claim 9.

13. The PET scanner according to claim 12 wherein the annular support structure includes:
a pair of rings on which the modules are mounted and wherein the cooling and mounting structure defines more electrical connector apertures and holes for receiving tile mounting pins than the number of mounted tiles; and
a spacer assembly in a space between the tiles and one of the detector rings which blocks the tiles from receiving oblique radiation, the spacer assembly including a movable shield ring adjacent to the detector modules, a support ring, and a spacer disposed between the movable shield ring and the support ring.

14. A method of mounting a radiation detector array comprising:
fashioning a plurality of tiles, each tile including:
a thermally conductive mount having a plurality of extending pins and an aperture,
an array of radiation detectors mounted on and thermally connected with the mount, the array including an electrical connector aligned with the mount aperture to be accessed therethrough;
mounting each of the plurality of tiles in a cooling and mounting structure including:
inserting the pins of each tile through corresponding holes of the cooling and mounting structure such that the pins extend through to a rear of the cooling and mounting structure and such that complementary surfaces of the tile and the cooling structure are brought into thermal contact and such that the mount apertures align with corresponding cooling and mounting structure apertures and such that the tiles are closely spaced with limited access to sides of adjoining tiles;
attaching electrical wiring to the electrical connector from the rear of the cooling and mounting structure through the cooling and mounting structure and mount apertures.

15. The method according to claim 14 further including:
removing one tile of the plurality of tiles from the cooling and support structure to repair, align or replace the tile including:
disconnecting the electrical wiring from the connector of the one tile from the rear of the cooling and mounting structure,
pushing the pins of the one tile from the rear of the cooling and mounting structure to eject the one tile; and
mounting a replacement tile on the cooling and support structure.

16. A generally annular PET detection system comprising:
a plurality of annular support rings;
a plurality of the radiation detection modules mounted to the annular support rings, each module including a cooling and mounting structure defining an array of pin receiving holes and an array of apertures and a plurality of tiles, each tile including:
thermally conductive mounts having pins configured to be received in the pin receiving holes of the cooling and mounting structure and having an aperture that aligns with one of the cooling and mounting structure apertures when the pins are received in the holes, an array of radiation detectors mounted to and in thermal contact with the mount, the array of detectors including an electrical connector disposed to be accessed through the aligned mount and cooling and mounting structure apertures.

17. A generally annular PET detection system comprising:

a pair of annular support rings;

a first annular shield ring disposed adjacent a first of the annular support rings;

a plurality of modules mounted to and supported by the annular support rings, each module including a cooling and support plate assembly which defines electrical connector apertures;

a plurality of tiles, each tile comprising a detector and an electrical connector on or recessed in a face of the tile such that the electrical connector aperture receives the electrical connector, each tile mounted to and supported by the cooling and support plate assembly of the respective module, the cooling and support plate assembly defining more electrical connector apertures than the number of mounted tiles such that different numbers of tiles can be mounted to the respective module in a group with a first side of the group adjacent the first annular shield ring; and a moveable annular shield ring mounted between a second of the annular support rings and the plurality of tiles such that the movable annular shield ring is positioned adjacent a second side of the group of tiles such that the movable annular shield ring can be disposed to accommodate different numbers of tiles.

* * * * *